United States Patent
Cop

(10) Patent No.: US 9,035,675 B2
(45) Date of Patent: May 19, 2015

(54) METHOD AND DEVICE FOR OFF-LINE TESTING OF ELECTRIC MOTORS

(71) Applicant: SUBSEE RAA AB, Raa (SE)

(72) Inventor: Boris Cop, Helsingborg (SE)

(73) Assignee: SUBSEE RAA AB (SE)

( * ) Notice: Subject to any disclaimer, the term of this patent is extended or adjusted under 35 U.S.C. 154(b) by 272 days.

(21) Appl. No.: 13/848,795

(22) Filed: Mar. 22, 2013

(65) Prior Publication Data

US 2013/0229203 A1    Sep. 5, 2013

Related U.S. Application Data

(63) Continuation of application No. 12/664,069, filed as application No. PCT/SE2008/000392 on Jun. 12, 2008, now Pat. No. 8,405,417.

(30) Foreign Application Priority Data

Jun. 12, 2007 (SE) ...................................... 0701428

(51) Int. Cl.
  *G01R 31/28* (2006.01)
  *G01R 31/34* (2006.01)

(52) U.S. Cl.
  CPC ............ *G01R 31/2836* (2013.01); *G01R 31/34* (2013.01); *G01R 31/346* (2013.01)

(58) Field of Classification Search
  CPC .. G01R 31/34; G01R 31/025; G01R 31/2836; H02P 29/021; H02P 21/06; H02H 7/08; H02H 7/0805
  See application file for complete search history.

(56) References Cited

U.S. PATENT DOCUMENTS 5,291,128 A * 3/1994 Shekar et al. ............ 324/765.01
5,488,281 A * 1/1996 Unsworth et al. ............ 318/806

FOREIGN PATENT DOCUMENTS

WO    2005106514 A1    11/2005

OTHER PUBLICATIONS

Stone, G.C. and Culbert, I., Electrical testing of low and medium voltage motors, Pulp and paper industry technical conference, 2007. Conference record of annual 20070601. IEEE. pp. 48-54. Published Jun. 1, 2007. ISBN 978-1-4244-1191-7, ISBN 1-4244-1191-2. XP031124476; sections 2.2-2.5.

(Continued)

*Primary Examiner* — Tung X Nguyen
(74) *Attorney, Agent, or Firm* — Volpe and Koenig, P.C.

(57) ABSTRACT

A method for off-line testing of an electric motor is disclosed. The motor having at least one stator winding, and a rotor arranged along a rotation axis. The method includes applying a periodic test signal to the at least one stator winding; collecting first measuring data, related to a physical quantity of the at least one stator winding while the rotor is being rotated about the rotation axis, from one or more waveform periods of the test signal, detecting first peak values of the first measuring data; forming second measuring data based on the first detected peak values, detecting second peak values of the second measuring data for the at least one stator winding; determining a mutual relationship between the at least a portion of the second peak values; and, providing, if the mutual relationship deviates from a predetermined relationship, a signal indicating a fault in the rotor. Also disclosed is an apparatus for performing the disclosed methods.

20 Claims, 4 Drawing Sheets

(56) References Cited

OTHER PUBLICATIONS

Yang, Jinkyu et al., An advanced stator winding insulation quality assessment technique for inverter-fed machines, The 2006 IEEE industry applications conference forty first IAS annual meeting, Conference record of 20061001. IEEE. Ed. Del Ferraro, L. et al. pp. 1562-1569, published Oct. 1, 2006. XP031026232; section III, section IV.E.

* cited by examiner

METHOD AND DEVICE FOR OFF-LINE TESTING OF ELECTRIC MOTORS

CROSS REFERENCE TO RELATED APPLICATION(S)

This application is a continuation of U.S. patent application Ser. No. 12/664,069, filed on Apr. 8, 2010, Now U.S. Pat. No. 8,405,417 which claims the benefit of PCT/SE08/00392, filed on Jun. 12, 2008, which claims priority from Swedish Application No. 0701428-5 filed on Jun. 12, 2007, which are incorporated by reference as if fully set forth.

FIELD OF THE INVENTION

The present invention relates to a method and apparatus for detecting rotor and stator faults in electric motors, such as induction motors and asynchronous motors.

BACKGROUND ART

Electric motors have a wide field of application. In industrial production, for example, electric motors are used to drive pumps, conveyor belts, overhead cranes, fans, etc. An electric motor, adapted for use in a specific application, offers the user many advantages, mainly owing to its long life and limited need for maintenance. One basic requirement for a long electric motor life is that the rotor or stator in the electric motor does not have any faults or defects. Common types of rotor faults are, for example, breaks or cracks/fractures in a rotor bar, excessively high resistance in welded or soldered joints in the rotor, excessively large air cavities (as a result of the casting of the rotor) and rotor offset in air gaps relatively to the stator. Common types of stator faults are, for example, insulation faults between the turns of a winding, insulation faults between windings in the same phase, insulation faults between windings in different phases, insulation faults between windings and earth/motor casing, contaminated windings (i.e. impurities such as moisture, dust, or insulation charred due to overheating), an open turn of a winding in a delta-connected motor as well as contact problems between the winding ends and external connections.

When testing electric three-phase motors, it is common to measure current fundamental components during operation and to compare measurement data from the three phases. Usually, special sensors are used in these measurements to obtain measurement data.

It is known that it is possible to perform both on-line measurements and off-line measurements. Measuring methods carried out during operation (on-line measurements) are sensitive to disturbances in the power grid, i.e. fundamentals generated by other machines (for example switched power supply units, fluorescent tube fittings, etc.) that are connected to the same power grid. These disturbances cause erroneous measuring results and may even make measurements on the electric motor impossible.

When testing stators off-line according to the prior art, a powerful surge voltage with high energy content is supplied to the motor, following which the exponentially decaying response obtained is analysed to identify possible faults in the stator. This measuring method has many disadvantages, such as it may initiate or accelerate/bring to completion incipient insulation failures; it requires time-consuming and complex calculations and interpretations/analyses; it causes problems of pulse propagation in the winding due to L and C effects; it requires bulky and heavy equipment associated with transport/installation problems; and it is an expensive method. WO 2005/106514 discloses a method for safe checking of electric motors. This method discloses measuring a physical quantity, such as current (I), inductance (L) or impedance (Z), of the stator winding while the rotor being rotated about an rotation axis. Thereby, periodic measuring data relating to the physical quantity is obtained, and measuring data relating to at least two periods of the periodic measuring data is collected. For the majority of all three-phase asynchronous motors, a sinusoidal relationship between the rotor position and the physical quantity (I, L or Z) is present, being symmetric about the X-axis in each phase. According to the method, the symmetry between at least the fundamentals of two or more half-cycles of the collected measuring data is compared. Asymmetry in the measuring data indicates a rotor and/or stator fault.

When performing the method disclosed in WO 2005/106514, the rotor has to be rotated in fixed steps of equal size or by continuous rotation at a constant rate. If the rotor is not rotated in fixed steps or at constant rate, asymmetry in the measuring data occurs. Normally, this asymmetry would indicate a rotor/stator fault, but could also be due to non-continuous rotation. Therefore, it is important that the rotor is being rotated in fixed steps or by continuous rotation for obtaining a reliable result. Since it may be difficult under some circumstances to obtain a perfect rotation of the rotor, either by continuous rotation or at fixed steps, especially when rotating the rotor by hand, this requirement may be hard to fulfill for the above described technique under these circumstances.

SUMMARY OF THE INVENTION

It is an object of the present invention to provide an improvement of the above techniques and prior art.

A particular object is to provide a method and apparatus facilitating measuring and analysing/detecting rotor and stator faults, and that eliminates a source of error, thus obtaining a more accurate result when performing the inventive method and using the inventive apparatus.

A further object is to provide a method and apparatus for measuring and analysing/detecting rotor and stator faults eliminating or reducing the need for rotating the rotor at a constant rate or by fixed and equal steps.

According to a first aspect of the invention, a method for off-line testing of an electric motor, which motor comprises at least one stator winding, and a rotor arranged along a rotation axis, is provided. The method comprises:

applying a periodical test signal to the at least one stator winding, collecting first measuring data, related to a physical quantity of the at least one stator winding while the rotor is being rotated about the rotation axis, from one or more waveform periods of the test signal, detecting first peak values of the first measuring data, forming second measuring data based on said first detected peak values, detecting second peak values of said second measuring data for the at least one stator winding, determining a spread of at least a portion of said second peak values, providing, if said spread exceeds a predetermined threshold, a signal indicating a fault in said rotor.

An advantage of the above described method is that the rotor no longer has to be rotated at a constant rate or with fixed and equal steps as required in the prior art. Since the symmetry of the second measuring data no longer has to be compared as in the prior art, no continuous rotation is required, thus simplifying the inventive method. In the inventive method, only the peak values of the second measuring data have to be determined for indicating a fault in the rotor during the testing.

Additionally, the source of error occurring in the prior art, due to the asymmetry caused by non-continuous rotation of the rotor, has been eliminated or reduced, resulting in a more reliable test result.

Further, it is possible, when using the inventive method, to identify that when a spread of at least a portion of said second peak values is occurring, the fault is in the rotor. Thereby, no additional testing has to be performed in order to clarify whether the fault is present in the stator or the rotor. Thus, the inventive method is time-saving and more precise than the prior art solutions.

The physical quantity may be an inductance (L) of the stator winding. An advantage of measuring the inductance of the stator winding is that common stator and rotor faults result in a change of the inductance for that specific winding. Thereby, the inductance of the stator winding can be used to indicate a stator/rotor fault. By measuring the inductance of the stator winding, the internal resistance of the stator windings does not have to be taken into account.

The physical quantity may be an impedance (Z) of the stator winding. An advantage of measuring the impedance of the stator winding is that common stator and rotor faults result in a change of the impedance for that specific winding. Thereby, the impedance of the stator winding can be used to indicate a stator/rotor fault. It is normally very simple to measure the impedance of the stator windings, which is advantageous when the internal resistance of the windings are known.

The electric motor may be a three-phase asynchronous motor.

According to a second aspect of the invention, a method for off-line testing of an electric motor, which motor comprises a stator with at least two stator windings, and a rotor arranged along a rotation axis, is provided. The method comprises:

applying a periodical test signal to the at least two stator windings, collecting first measuring data, related to a physical quantity of the at least two stator windings while the rotor is being rotated about the rotation axis, from one or more waveform periods of the test signal, detecting first peak values of the first measuring data for each of said stator windings, forming second measuring data based on said first detected peak values for each of said stator windings, forming a mean value of the second measuring data for each of said stator windings, providing, if said mean values differ from a predetermined pattern, a signal indicating a fault in said stator.

An advantage of the above described method is that the rotor no longer has to be rotated at a constant rate or with fixed and equal steps as required in the prior art. Since the symmetry of the second measuring data no longer has to be compared as in the prior art, no continuous rotation is required, thus simplifying the inventive method. In the inventive method, only the mean values of the second measuring data have to be determined for indicating a fault in the stator during the testing.

Additionally, the source of error occurring in the prior art, due to the asymmetry caused by non-continuous rotation of the rotor, has been eliminated or reduced, resulting in a more reliable test result.

Further, it is possible, when using the inventive method, to identify that when the mean values differs from a predetermined pattern, the fault is in the stator. Thereby, no additional testing has to be performed in order to clarify whether the fault is present in the stator or the rotor. Thus, the inventive method is time-saving and more precise than the prior art solutions.

According to a third aspect of the invention, an apparatus for off-line testing of an electric motor, which motor comprises at least one stator winding, and a rotor arranged along a rotation axis, is provided. The apparatus comprises:

means for applying a periodical test signal to the at least one stator winding, means for collecting first measuring data, related to a physical quantity of the at least one stator winding while the rotor is being rotated about the rotation axis, from one or more waveform periods of the test signal, means for detecting first peak values of the first measuring data, means for forming second measuring data based on said first detected peak values, means for detecting second peak values of said second measuring data for the at least one stator winding, means for determining a spread of at least a portion of said second peak values, means for providing, if said spread exceeds a predetermined threshold, a signal indicating a fault in said rotor.

According to a fourth aspect of the invention, an apparatus for off-line testing of an electric motor, which motor comprises a stator with at least two stator windings, and a rotor arranged along a rotation axis, is provided. The apparatus comprises:

means for applying a periodical test signal to the at least two stator windings, means for collecting first measuring data, related to a physical quantity of the at least two stator windings while the rotor is being rotated about the rotation axis, from one or more waveform periods of the test signal, means for detecting first peak values of the first measuring data for each of said stator windings, means for forming second measuring data based on said first detected peak values for each of said stator windings, means for forming a mean value of the second measuring data for each of said stator windings, means for providing, if said mean values differ from a predetermined pattern, a signal indicating a fault in said stator.

The two apparatus incorporate all the advantages of the methods, which previously have been discussed. Whereby, the previous discussion is applicable also for the inventive apparatus, respectively.

BRIEF DESCRIPTION OF THE DRAWINGS

The present invention will be further described hereinafter with reference to the accompanying drawings, which show an embodiment of the invention as a non-limiting example.

DETAILED DESCRIPTION OF PREFERRED EMBODIMENT(S)

Figure 1:
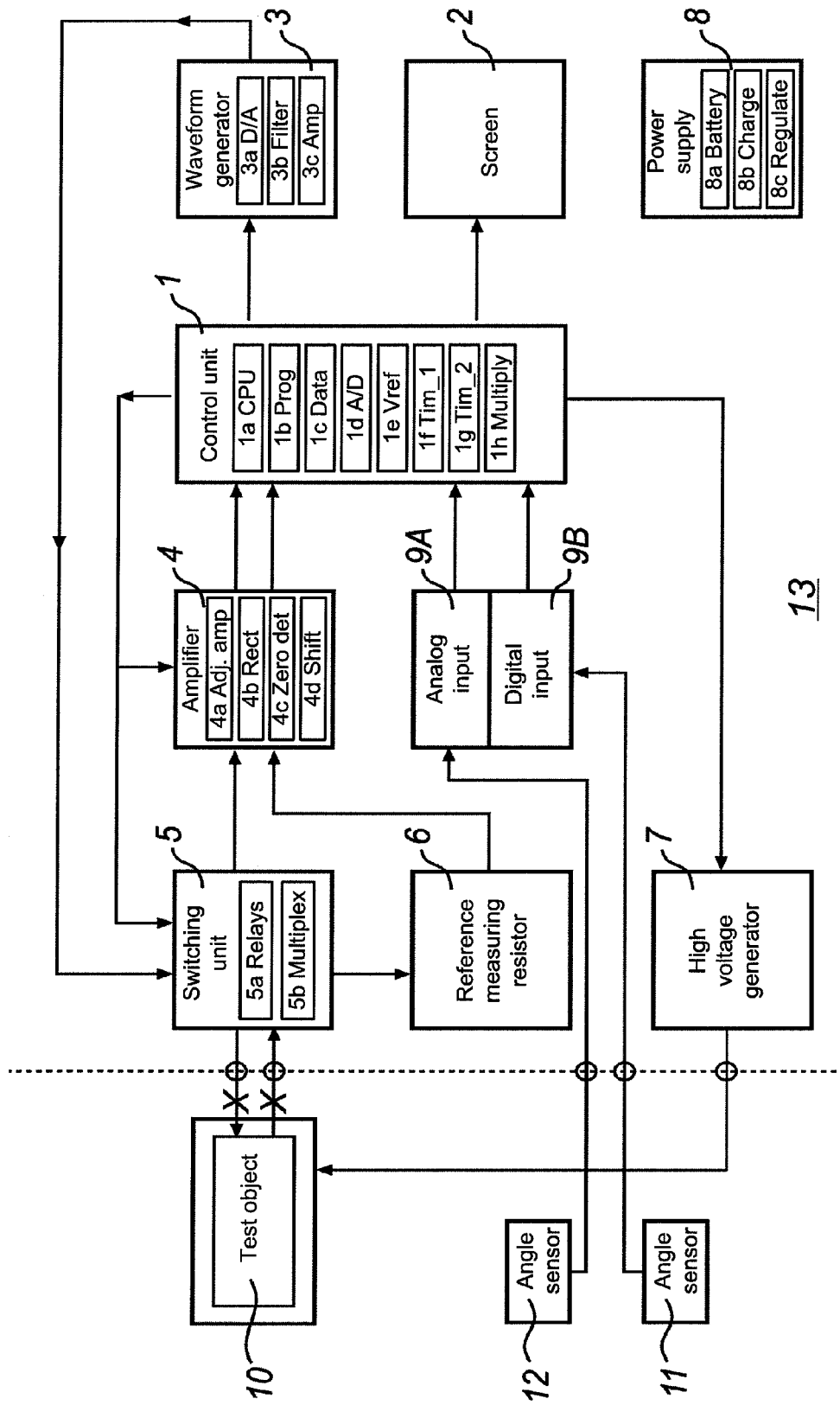
FIG. 1 is a block diagram of a preferred embodiment of a measuring device according to the present invention.

A system in which the present invention may be applied will first be described with reference to FIG. 1.

Referring to the block diagram in FIG. 1, a preferred embodiment of a measuring device 13 according to the present invention will be described. The measuring device 13 comprises a control unit 1, which preferably comprise: a CPU 1a, a program memory 1b, a data memory 1c, an ND converter 1d, a voltage reference 1e, a first timer (A) 1f, a second timer (B) 1g and a hardware multiplier 1h.

The measuring device 13 may comprise a screen 2, which is connected to the control unit 1.

The measuring device 13 comprises a waveform generator 3 connected to the control unit, which preferably comprises: a D/A converter 3a, a reconstruction filter 3b and a power amplifier 3c.

The measuring device 13 comprises measuring amplifiers 4 in two channels, which preferably comprise: adjustable amplifiers 4a, rectifiers 4b, zero detectors 4c and level shifters 4d.

The measuring device 13 comprises a switching unit 5 for providing inputs and outputs to a test object 10. The switching unit, which is connected to an input of the measuring amplifier 4, preferably comprises relays 5a and analogue multiplexers 5b.

Furthermore, the measuring device 13 comprises a reference measuring resistor 6, which is connected between the switching unit 5 and an input of the measuring amplifier 4.

The measuring device 13 comprises a power supply device 8, which preferably comprises one or more batteries 8a, battery charging device 8c, one or more voltage regulators 8c and an LCD biasing generator.

Moreover, the measuring device preferably comprises one or more analogue inputs 9a and digital inputs 9b. The control unit 1 monitors and controls the screen 2, the waveform generator 3, the measuring amplifiers 4, the switching unit 5, the reference measuring resistor 6, the high-voltage generator 7 and the power supply device 8, in accordance with program instructions stored in the memory 1b, and records and calculates output data according to given program instructions, the result may be illustrated on the screen 2. More specifically, the control unit 1 controls the waveform generator 3 to generate a sinusoidal signal, whose frequency is preferably in the range of 25-800 Hz and whose voltage is preferably 1 V rms. The generated voltage is applied to the test object 10 via power amplifiers 3c and the switching unit 5. The current thus generated causes a voltage across the measuring resistor 6, the measuring amplifier 4 being controlled to measure the voltage across the measuring resistor 6 and the test object, respectively.

A first input of a first zero-crossing detector 4c is connected to the output of the waveform generator 3. The output represents the phase displacement of the voltage across the test object 10. A second zero-crossing detector 4c is connected to the output of the amplifier 4a which is adjustable to match the measuring resistor 6, and its output signal represents the phase displacement of the current through the test object 10, thereby measuring an phase angle Fi.

The above connection allows the current (I) through the test object 10 to be calculated. It also allows the impedance (Z), inductance (L) and resistance (R) to be calculated. The phase angle Fi is also measured. The program instructions required by the control unit 1 to carry out the above measurements/calculations are stored in the memory 1b.

In a rotor test according to the present invention, 1 the rotor position influences the measured value of the current (I), the impedance (Z), the inductance (L) and the phase angle (Fi) in the stator windings. The measured values vary between min/max, depending on the position of the rotor relatively to the stator. By measuring any of I, Z, L and Fi in at least one stator winding during rotation of the rotor, determining first peak values of the measured quantity, forming second measuring data, then determining peak values from the second measuring data, and finally determining a spread of at least a portion of the second peak values, any rotor unbalance present will be detected, i.e. if the spread of at least a portion of the second peak values exceeds a predetermined threshold, an indication that there is a fault in the rotor will be provided. Alternatively, a pattern of the at least a portion of the second peak values may be determined. As indicated above, the determined values of the second peak values depend on the concentricity of the rotor and any centering error will provide an envelope in the values of the second peak values. Such a concentric pattern may hence be detected indicating a fault in the rotor.

In a rotor test, an angle sensor 11 may be connected to the shaft, wherein the measured value may be connected with the rotor position, the position thereby being the controlling factor when e.g. presenting the measurement results on the screen 2.

In a stator test according to the present invention, 1 the rotor position influences the measured value of the current (I), the impedance (Z), the inductance (L) and the phase angle (Fi) in the stator windings. The measured values vary between min/max, depending on the position of the rotor relatively to the stator. By measuring any of I, Z, L and Fi in at least two stator winding during rotation of the rotor, determining first peak values of the measured quantity for each stator winding, forming second measuring data, then determining peak values from the second measuring data for each stator winding, then forming a mean value based on said second detected peak values for each of the measured stator windings, any deviance between the measured quantity in the stator windings will be detected. Measurements on a properly functioning stator will generate mean values of substantially equal magnitude. Consequently, if the mean values differ from a predetermined pattern, a fault in the stator is present. Alternatively, a spread of the mean values may be detected, wherein a spread that exceeds a predetermined threshold, depending on e.g. the environmental conditions when the measurements are performed, will indicate a fault in the stator. As will be disclosed below, the patter may differ depending on the type of motor being tested.

Figure 2:
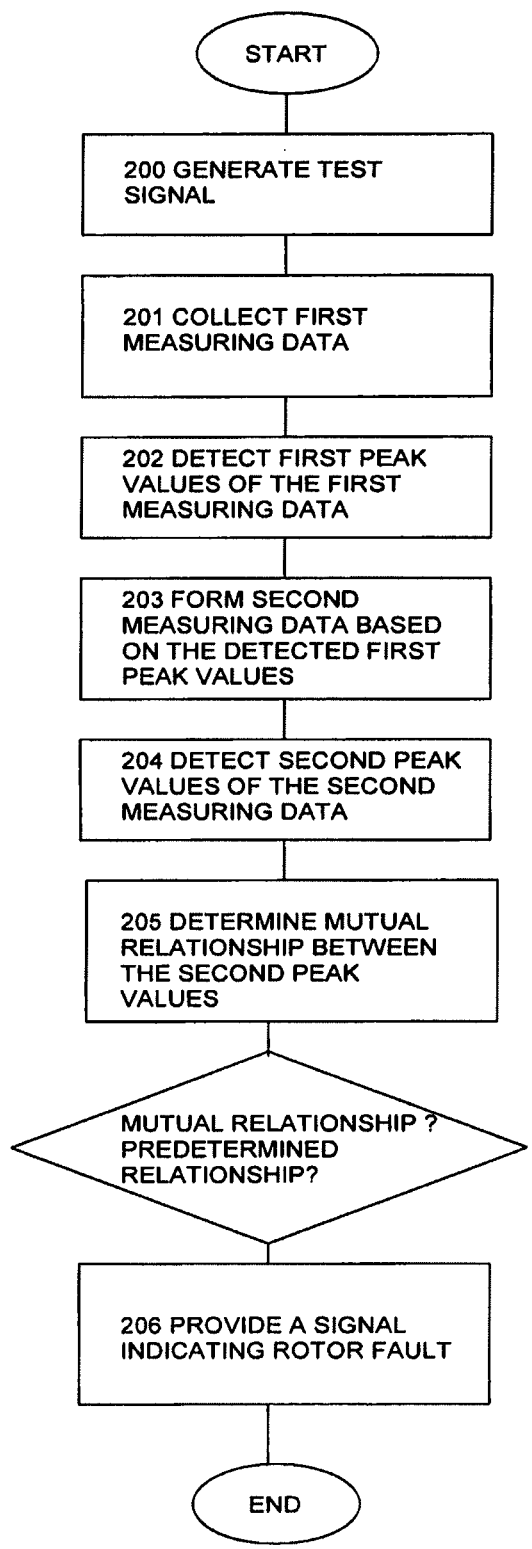
FIG. 2 is a flow chart of a method for off-line testing of an electric motor according to the present invention.

Referring to the flow chart in FIG. 2, a measuring method according to the present invention for indicating rotor faults will be described.

In step 200, the waveform generator 3 is started, thereby generating a periodical test signal, preferably in the range of 25-800 Hz and 1 V rms, and is connected via the power amplifier 3c and the switching unit 5 to the test object 10.

In step 201, the first measuring data, related to a physical quantity such as the current I, the impedance Z or the inductance L, is collected meanwhile the rotor is being rotated about the rotation axis. The first measuring data is collected form one or more waveform periods of the applied test signal. No uniform continuous rotation of the rotor is required for the inventive method.

In step 202, first peak values of the first measuring data collected in step 201 are detected.

In step 203, second measuring data are formed, based on the first detected peak values of the first measuring data. More specifically, in this step, the first peak values are extracted to form second measuring data.

In step 204, second peak values of the second measuring data formed in step 203 are detected.

In step 205, a spread or a pattern of at least a portion of the peak values of the second measuring data is determined for the at least one stator winding. The portion of the second peak values, used to determine the spread or pattern, may be all positive values or all negative values, respectively. Alternatively, if the absolute values of the second peak values are used, the portion may be selected more freely, such as the first ten determined peak values, ten determined peak values detected in the middle of the measured interval, every third determined peak value or any other portion of the determined second peak values.

In step 206, a signal indicating a fault in the rotor is provided, if the spread exceeds at predetermined threshold or if the pattern differs from a predetermined pattern. As mentioned above, the predetermined threshold is used to remove any undesired disturbance, errors in measurement any other variances. The signal may be transmitted to a screen, and transformed to a visual representation, or the signal may be transformed in any other way in order to be communicated to a person, or computer, performing and/or monitoring the testing.

Figure 3:
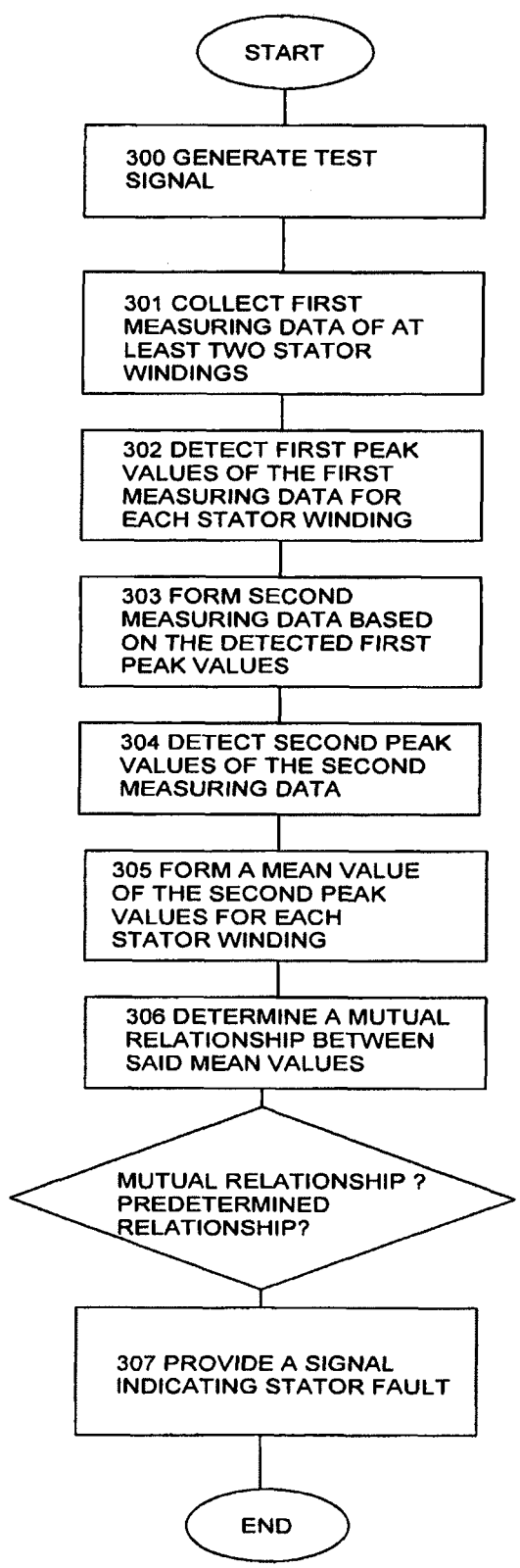
FIG. 3 is a flow chart of a method for off-line testing of an electric motor according to the present invention.

Referring to the flow chart in FIG. 3, a measuring method according to the present invention for indicating stator faults will be described.

In step 300, the waveform generator 3 is started, thereby generating a periodical test signal, preferably in the range of 25-800 Hz and 1 V rms, and is connected via the power amplifier 3*c* and the switching unit 5 to the test object 10. The periodical test signal is applied to at least two stator winding in case of testing the rotor, since data related to different stator windings later are compared.

In step 301, the first measuring data of the at least two stator windings, related to a physical quantity such as the current I, the impedance Z or the inductance L, is collected meanwhile the rotor is being rotated about the rotation axis. The first measuring data is being collected form'one or more waveform periods of the applied test signal. No continuous rotation of the rotor is required for the inventive method.

In step 302, first peak values of the first measuring data for each stator winding, which are collected in step 301, are detected.

In step 303, second measuring data are formed, based on the first detected peak values for each stator winding. More specifically, in this step, the first peak values are extracted to form second measuring data.

In step 304, second peak values of the second measuring data formed in step 303 are detected.

In step 305, a mean value of the second peak values of the second measuring data for each stator winding is formed.

In step 306, a mutual relationship between said mean values is determined.

In step 307, a signal indicating a fault in the stator is provided if the mutual relationship deviates from a predetermined relationship or predetermined pattern. The predetermined pattern may, for a stator with ordinary stator windings, be a spread of the mean values, exceeding a predetermined threshold value. For a stator with concentric windings, the predetermined pattern may be a step-like formation, where differences of the mean values are uniform.

The signal may be transmitted to a screen, and transformed to a visual representation, or the signal may be transformed in any other way in order to be communicated to a person, or computer, performing and/or monitoring the testing.

When applying the test signal the stator winding in step 200 and 300, the first measuring data in step 201 and 301 may be collected by measuring across the stator winding connections while the rotor being rotated about the rotation axis.

The electric motor may be an three-phase asynchronous motor, or another type of motor suitable for testing according to the disclosed methods.

Figure 4A:
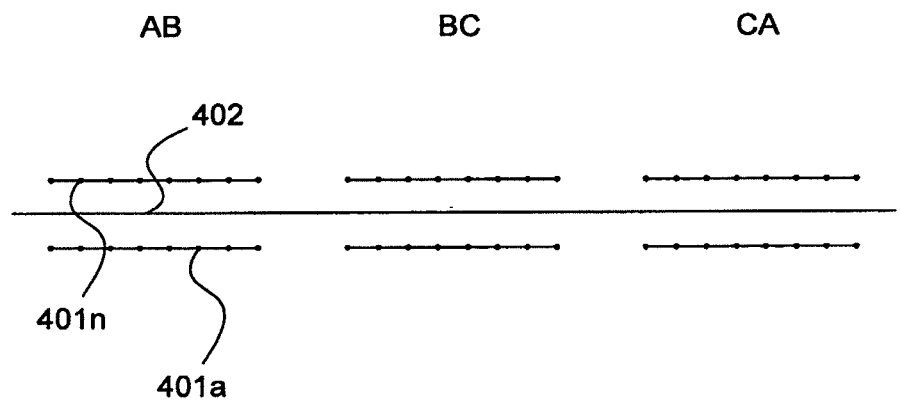
FIGS. 4a and 4b are schematic representation of detected second peak values and mean values formed thereof for three stator windings.
Figure 4B:
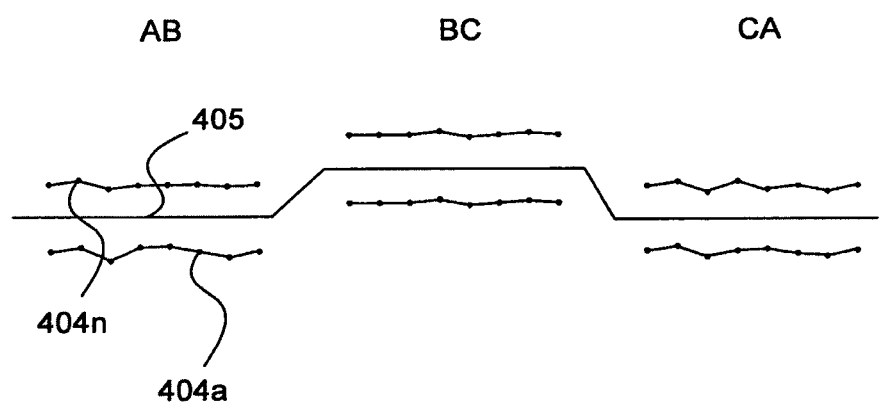

Referring to FIGS. 4A and B, a schematic representation of detected second peak values 401*a-n* are shown. The detected second peak values 401*a-n* of the stator winding AB are plotted in a diagram. Similarly, the detected second peak values for each of the stator BC and CA are also plotted in the diagram. As shown in FIG. 4A, the peak values 401*a-n* have a mutual relationship in that they are of equal magnitude, which indicates that the rotor is properly functioning, i.e. a predetermined relationship indicating a properly functioning rotor may be that the magnitude of the peak values are equal or that the peak values are arranged according to a predetermined pattern due to the design of the rotor. In contrast to the peak values shown in FIG. 4A, the peak values 404*a-n* shown in FIG. 4B are not of equal magnitude but are spread somewhat from an expected value. The spread indicates that the rotor is not functioning properly, but may be arranged off centre in the motor. Alternatively, the spread may be due to other rotor faults, such as cracks mentioned above.

Referring to FIG. 4A, a mean value 402 is formed of the detected second peak values for each stator winding AB, BC and CA and the mean values of the three stator windings are used in the inventive method for determining a mutual relationship or pattern. In FIG. 4A, the mutual relationship is indicated in that no deviation between the mean values of the stator windings AB, BC and CA, respectively, is identified (or no deviation exceeding a predetermined threshold or pattern is identified). Accordingly, the stator is properly functioning.

On the contrary, if a deviation is detected between the mean values of the stator windings AB, BC and CA, respectively, as shown in FIG. 4B, a fault is present in the stator. The deviation may be a deviation from a predetermined pattern or the deviation may be a spread of the mean values between the stator windings.

By way of example, a measuring method for collecting the first and second measuring data mentioned in steps 201-204 and 301-304 above will now be described in more detail.

The waveform generator 3 is started, thereby generating a periodical test signal, preferably in the range of 25-800 Hz and 1 V rms, and is connected via the power amplifier 3*c* and the switching unit 5 to the test object 10 and the measuring resistor 6 optionally via connector terminals (indicated by X in FIG. 1). More specifically, the waveform generator 3 is started by starting the timer (B) 1*g* and uploading a value corresponding to a sampling time t1. When the timer has counted down to zero, an interrupt is generated which causes the CPU 1*a* to retrieve/look up the value of sample no. 1 in a table stored in the program memory 1*b*, the value being supplied to the D/A-converter 3*a*. At the same time, the timer (B) 1*g* is restarted and reloaded with the value of t1.

This process is repeated in connection with/after each interrupt of timer (B) 1*g* by retrieving the next sample in the program memory 1*b* and supplying it to the D/A-converter 3*a*, thereby generating a series of discreet voltage levels representing the desired waveform plus the sampling frequency 1/t1. This signal is then sent to a low-pass/reconstruction filter 3*b*, the function of which is to filter out the sampling frequency and any non-desirable frequency components, so that only the desired waveform remains. Before the waveform can be applied to the test object 10, impedance matching has to be effected. This takes place in the power amplifier 3*c* from which the waveform is relayed to the test object 10 via relays in the switching unit 5.

The voltage across the test object 10 and the measuring resistor 6, respectively, is registered in the measuring amplifier 4. This is effected by the CPU 1*a* setting the relays 5*a* and multiplexers 5*b* in the switching unit 5 so that the voltage across respectively the test object 10 and the measuring resistor 6, which are connected in series, is switched to a respective adjustable amplifier 4a, 4b. The CPU sets the amplifiers 4a, 4b to the lowest amplifying level. The signals are then sent to rectifiers 4c in which they are subjected to full-wave rectification, following which they are each supplied to a level shifter 4e, which adapts the levels to the A/D converter 1d. In this amplifying and switching state, the CPU 1a starts the A/D converter 1d, which together with the voltage reference 1e via a software-based peak value detector returns the peak voltage of both signals. Using these peak values, the CPU 1a selects/calculates an optimal amplifying level for the adjustable amplifier of each channel and applies them. In these new amplifying states, the CPU 1a again starts the A/D converter 1d, which together with the voltage reference 1e via a first software-based peak value detector returns the peak voltage of both signals. Using these peak values, the CPU 1a verifies that the optimal amplifying state for the adjustable amplifier of each channel has been obtained. If this is not the case, i.e. if any one channel is overdriven the CPU 1a may reduce the amplifying level by one step and apply the same. Alternatively, the signal across the measuring resistor can be so low that the CPU interprets this as if no test object were connected. Preferably, the maximum amplitude of the waveform generator 3 is also known.

The input of the first zero-crossing detector is connected to the output of the waveform generator 3. The output signal can be said to represent the phase displacement of the voltage across the test object 10. The second zero-crossing detector is connected to the output of the adjustable amplifier adapted for the measuring resistor 6 and its output signal represents the phase displacement of the current through the test object 10.

A measurement of I, Z or L is then performed. The measuring comprises the use of the first software-based peak value detector in order to collect the first peak values of the first measuring data. Meanwhile the collection of the first measuring data and during the rotation of the rotor, the peak values may simultaneously be formed from the first measuring data. Alternatively, the formation of the peak values from the first measuring data may be conducted after the collection of the first measuring data has be finalised.

An initialization of the registration/memorizing of minimum and maximum values of I, Z and/or L is then performed.

A second software-based peak value detection is then carried out in order to detect a number of min/max cycles in the waveform resulting from the rotor signature envelope. The second peak value detection may be based on essentially the same software algorithm as for the first peak value detection, but differs in terms of the input data and waveform processed. The input data for the second peak value detector is the measurement result from one or more measuring cycles, i.e. output data from the first peak value detector. The waveform measured, on the basis of which the min/max values are obtained, is the rotor signature envelope, which is of sinusoidal or other shape, which appears from the envelope after a sufficiently large number of collected measurement results.

The result from the second peak detection may then be used in the subsequent determination of the spread or mean value of the measuring data according to steps 205ff and 305ff.

Additionally, prior to performing the measurements above, the apparatus preferably starts by an automatic change-over of measurement inputs for the purpose of measuring any interference voltage level (Uemi) possibly induced in the motor due to external interference fields, if any. If the level is too high, it is displayed on the screen of the apparatus, thereby allowing the user to take different measures in an attempt to reduce the interference level, for example grounding the test object to earth, etc. Thus, the ability of the apparatus to determine excessive interference voltage levels (Uemi) is a highly advantageous feature, since an excessive interference voltage level causes erroneous measurement results.

If the interference level is sufficiently low, the apparatus proceeds, preferably automatically, by measuring and/or calculating the following quantities:

Resistance (R), which is used to detect breakage in connectors or windings, loose connections, contact resistance and direct short circuits.

Impedance (Z) and inductance (L), which are used in combination to detect the presence of different impurities in the windings. These may be, for example, in the form of dust, moisture or charred insulation (due to overheating), which all cause small changes in the capacitance of the winding being measured. In most cases, the capacitance increases, which causes a reduction of the impedance Z. Moreover, the capacitive reactance will have a greater influence on the impedance (Ohm's law), since the test signal applied has low amplitude and the capacitance value therefore is even more dominant.

In the case of insulation charred due to overheating, the capacitance may instead decrease, thereby causing the impedance to increase in one or more phases.

As mentioned above, of all the measurement quantities, the inductance L is the one least likely to change due to a fault in the stator. Owing to this "inertia" the measurement results for L can be used as a form of reference or base line for comparison with changes in Z.

However, depending on the motor type the values of L and Z will unfortunately vary to different degrees between the phases. The reason for this variation is that the effect of the rotor position on the relative inductance between the rotor and the stator may be different in each phase.

It is contemplated that there are numerous modifications of the embodiments described herein, which are still within the scope of the invention as defined by the appended claims.

What is claimed is:

1. A method for off-line testing of an electric motor, the motor having at least one stator winding, and a rotor arranged along a rotation axis, the method comprises:
    applying an ac test signal to the at least one stator winding;
    measuring an ac amplitude of a response signal, related to a physical quantity of the at least one stator winding, while the rotor is being rotated about the rotation axis, the response signal resulting from the applying of the test signal and the rotation of the rotor;
    determining amplitude maxima for the response signal;
    determining a mutual relationship between at least a portion of the amplitude maxima; and
    providing, if the mutual relationship deviates from a predetermined relationship, a signal indicating a fault in the rotor.

2. The method according to claim 1, wherein the mutual relationship corresponds to a spread of the at least a portion of the amplitude maxima, and the deviation of the relationship corresponds to when the spread exceeds a predetermined threshold.

3. The method according to claim 1, wherein the mutual relationship corresponds to a pattern of the at least a portion of amplitude maxima, and the deviation of the relationship corresponds to when the pattern deviates from a predetermined pattern of the values of at least a portion of the amplitude maxima.

4. The method according to claim 1, wherein the physical quantity is an inductance (L) of the stator winding.

5. The method according to claim 1, wherein the physical quantity is an impedance (Z) of the stator winding.

6. The method according to claim 1, wherein the electric motor is a three-phase asynchronous motor.

7. A method for off-line testing of an electric motor, the motor having a stator with a first and a second stator windings, and a rotor arranged along a rotation axis, the method comprises:
- applying an ac test signal to the first and second stator windings;
- measuring an ac amplitude of a first response signal, related to a physical quantity of the first stator winding, while the rotor is being rotated about the rotation axis, the first response signal resulting from the applying of the first test signal and the rotation of the rotor;
- measuring an ac amplitude of a second response signal, related to a physical quantity of the second stator winding, while the rotor is being rotated about the rotation axis, the second response signal resulting from the applying of the second test signal and the rotation of the rotor;
- forming a first mean value of the ac amplitude of the first response signal;
- forming a second mean value of the ac amplitude of the second response signal;
- determining a mutual relationship between the first and second mean values; and
- providing, if the mutual relationship deviates from a predetermined relationship, a signal indicating a fault in the stator.

8. The method according to claim 7, wherein the mutual relationship corresponds to a spread of mean values, and the deviation of the relationship corresponds to when the spread exceeds a predetermined threshold.

9. The method according to claim 7, wherein the mutual relationship corresponds to a pattern of the mean values, and the deviation of the relationship corresponds to when the pattern deviates from a predetermined pattern of the mean values.

10. The method according to claim 7, wherein the physical quantity is an inductance of a stator winding (L).

11. The method according to claim 7, wherein the physical quantity is an impedance of a stator winding (Z).

12. The method according to claim 7, wherein the electric motor is a three-phase asynchronous motor.

13. An apparatus for off-line testing of an electric motor, the motor having at least one stator winding, and a rotor arranged along a rotation axis, the apparatus comprises:
- a generator to apply an ac test signal to the at least one stator winding;
- a measuring device to measure an ac amplitude of a response signal, related to a physical quantity of the at least one stator winding, while the rotor is being rotated about the rotation axis, the response signal resulting from the applying of the test signal and the rotation of the rotor;
- an amplitude detector to determine amplitude maxima for the response signal;
- a mutual relationship detector to determine a mutual relationship between at least a portion of the amplitude maxima; and
- a signaling device to provide, if the mutual relationship deviates from a predetermined relationship, a signal indicating a fault in the rotor.

14. The apparatus according to claim 13, wherein the mutual relationship corresponds to a spread of the at least a portion of the amplitude maxima, and the deviation of the relationship corresponds to when the spread exceeds a predetermined threshold.

15. The apparatus according to claim 13, wherein the mutual relationship corresponds to a pattern of the at least a portion of the amplitude maxima, and the deviation of the relationship corresponds to when the pattern deviates from a predetermined pattern of the values of the at least a portion of the second peak values.

16. An apparatus for off-line testing of an electric motor, the motor comprises having a stator with at least two stator windings, and a rotor arranged along a rotation axis, the apparatus comprises:
- a generator to apply an ac test signal to the first and second stator windings;
- a first response signal measuring device to measure an ac amplitude of a first response signal, related to a physical quantity of the first stator winding, while the rotor is being rotated about the rotation axis, the first response signal resulting from the applying of the first test signal and the rotation of the rotor;
- a second response signal measuring device to measure an ac amplitude of a second response signal, related to a physical quantity of the second stator winding, while the rotor is being rotated about the rotation axis, the second response signal resulting from the applying of the second test signal and the rotation of the rotor;
- a first mean value forming device to form a first mean value of the ac amplitude of the first response signal;
- a second mean value forming device to form a second mean value of the ac amplitude of the second response signal;
- a detector to determine a mutual relationship between the first and second mean values; and
- a signaling device to provide, if the mutual relationship deviates from a predetermined relationship, a signal indicating a fault in the stator.

17. The apparatus according to claim 16, wherein the mutual relationship corresponds to a spread of mean values, and the deviation of the relationship corresponds to when the spread exceeds a predetermined threshold.

18. The apparatus according to claim 16, wherein the mutual relationship corresponds to a pattern of the mean values, and the deviation of the relationship corresponds to when the pattern deviates from a predetermined pattern of the mean values.

19. The apparatus according to claim 13 wherein the physical quantity is an inductance of a stator winding (L).

20. The apparatus according to claim 13, wherein the physical quantity is an impedance of the stator winding (Z).

* * * * *